United States Patent [19]

Yamazaki

[11] Patent Number: 4,912,527
[45] Date of Patent: Mar. 27, 1990

[54] OPTICAL APPARATUS FOR PULLING AN INTERMEDIATE FREQUENCY IN A PREDETERMINED FREQUENCY RANGE

[75] Inventor: Shuntaro Yamazaki, Tokyo, Japan

[73] Assignee: NEC Corporation, Tokyo, Japan

[21] Appl. No.: 222,481

[22] Filed: Jul. 21, 1988

[30] Foreign Application Priority Data

Jul. 24, 1987 [JP] Japan .................................. 62-185922
Sep. 18, 1987 [JP] Japan .................................. 62-233838

[51] Int. Cl.$^4$ ........................................... H04B 10/06
[52] U.S. Cl. ....................................... 455/619; 455/610
[58] Field of Search ............... 455/619, 617, 606, 607, 455/610, 164, 616; 370/3

[56] References Cited

U.S. PATENT DOCUMENTS

| 4,625,331 | 11/1986 | Richardson et al. | 455/164 |
| 4,704,741 | 11/1987 | Shikada | 455/619 |
| 4,727,591 | 2/1988 | Manlove | 455/164 |

FOREIGN PATENT DOCUMENTS 0047524  3/1985  Japan ................................. 455/619

OTHER PUBLICATIONS

S. Lowney and D. Marquis, "Frequency Acquisition and Tracking for Optical Heterodyne Communication Systems", Jour. Lightwave Tech., vol. LT—5, No. 4, 4/87, pp. 538–550.

"New Polarisation—State Control Device: Rotatable Fibre Cranks", ELECTRONICS LETTERS, Sep. 26, 1985, vol. 21, No. 20, pp. 895–896; Okoshi et al.

Y. Yamamoto et al., "Coherent Optical Fiber Transmission Systems", IEEE JOURNAL OF QUANTUM ELECTRONICS, vol QE—17, No. 6, Jun. 1981, pp. 919–935.

Primary Examiner—Benedict V. Safourek
Assistant Examiner—L. Van Beek
Attorney, Agent, or Firm—Sughrue, Mion, Zinn, Macpeak & Seas

[57] ABSTRACT

In an optical apparatus for pulling an intermediate frequency in a predetermined frequency range, a local oscillation light source is swept in an oscillation frequency thereof in accordance with a signal applied to a frequency adjusting terminal thereof. The signal is of a counted value of a counter which counts pulse signals of an oscillator. When an intermediate frequency is pulled in a predetermined frequency range including a predetermined intermediate frequency, the counter is stopped to count the pulse signals, and is controlled to hold a then counted value which will be a fixed driving signal for the local oscillation light source.

4 Claims, 8 Drawing Sheets

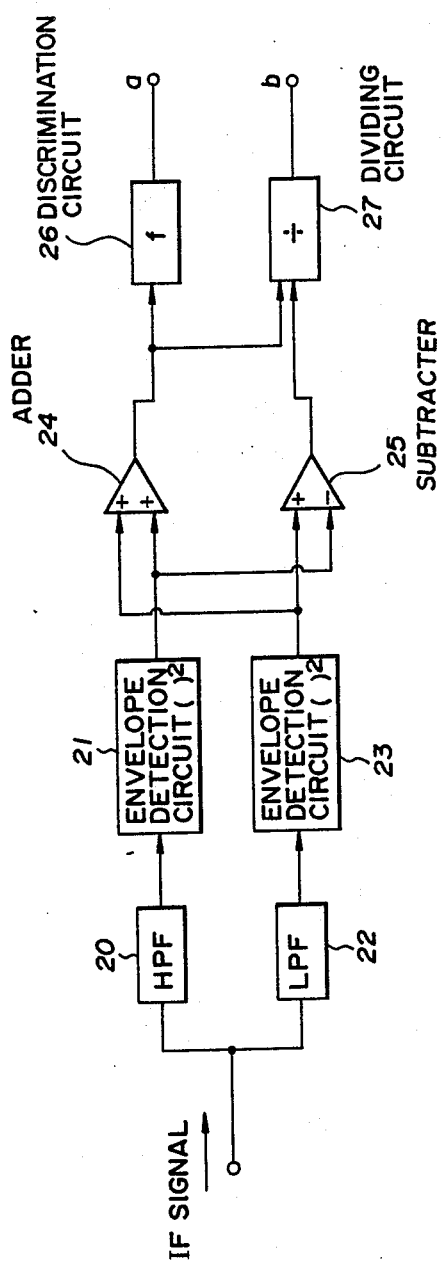

OPTICAL APPARATUS FOR PULLING AN INTERMEDIATE FREQUENCY IN A PREDETERMINED FREQUENCY RANGE

FIELD OF THE INVENTION

The invention relates to an optical apparatus for pulling an intermediate frequency in a predetermined frequency range, and more particularly to an optical apparatus for pulling an intermediate frequency in a predetermined frequency range which is applied to a coherent light communication system.

BACKGROUND OF THE INVENTION

In an optical heterodyne detection communication system, a long distance and high density transmission can be performed because a receiving sensitivity is much increased as compared to a direct detection communication system in which light intensity is modulated, and because a frequency utilizing efficiency is high as described in "Coherent Optical Fiber Transmission Systems" reported in IEEE QE-17, No. 6, June 1981, pp. 919–935 by Y. Yamamoto and T. Kimura.

In the coherent light communication, signal light supplied from an optical transmitter and local oscillation light radiated from a local oscillation light source contained in an optical receiver are combined to produce an intermedeate frequency signal which is a beat signal corresponding to a frequency difference between the signal light and the local oscillation light. In an optical detector, the intermediate frequency signal is converted from optical signal to electric signal which is then demodulated to produce a baseband signal. In the optical receiver, the frequency difference must be stabilized to be constant. For this purpose, an automatic frequency control (AFC) circuit is provided therein to stabilize the intermediate frequency.

In a conventional coherent light communication system, it is necessary to pull an intermediate frequency in a frequency range of the AFC by sweeping a frequency of a local oscillation light beforehand because a frequency of a local oscillation light source is fluctuated much wider than the intermediate frequency, so that the AFC is performed properly.

In the conventional coherent light communication system, however, an intermediate frequency is not automatically pulled in a frequency range of the AFC, but a manual adjustment has been performed. Although only one apparatus in which an intermediate frequency is automatically pulled in a frequency range of the AFC is described in a report entitled "Frequency Acquisition and Tracking for Optical Heterodyne Communication Systems" in "Journal of Lightwave Technology, Vol. LT-5, No. 4, April 1987," the construction thereof is very complicated.

In the conventional coherent light communication system, further, a level of the intermediate frequency signal is fluctuated to result in a deterioration of a receiving property because polarizations of the local oscillation light and the signal light tend to be inconsistent with each other. In order to avoid the inconsistence of the polarizations, a polarization control device must be provided therein so that a level of the intermediate frequency signal is maximized by controlling polarizations of the local oscillation light and the signal light separately from the control of an intermediate frequency as described in "New Polarisation-State Control Device : Rotatable Fiber Cranks" reported in Electronics Letters, Sept. 26, 1985, Vol. 21, No. 20, pp. 895–896 by T. Okoshi.

However, there are further disadvantages that a high frequency stabilization is not obtained because the level fluctuation of an intermediate frequency signal is mixed with a control signal by which a frequency of the local oscillation light is stabilized, and that a system scale becomes large because two systems for stabilizing a frequency of the local oscillation light and for controlling polarizations of the local light oscillation light and the signal light are necessary to be provided therein.

SUMMARY OF THE INVENTION

Accordingly, it is an object of the invention to provide an optical apparatus for pulling an intermediate frequency in a predetermined frequency range in which the construction thereof is simplified.

It is a further object of the invention to provide an optical apparatus for pulling an intermediate frequency in a predetermined frequency range in which a high frequency stabilization is obtained.

It is a still further object of the invention to provide an optical apparatus for pulling an intermediate frequency in a predetermined frequency range in which a system scale does not become large.

According to the invention, an optical apparatus for pulling an intermediate frequency in a predetermined frequency range comprises, a sweep circuit for supplying a sweep signal to a local oscillation light source which is thereby driven to produce local oscillation light, said local oscillation light being combined with signal light received in an optical heterodyne receiver to produce an intermediate frequency signal, and a control circuit for supplying a control signal to said sweep circuit which is thereby stopped to produce said sweep signal when a frequency of said intermediate frequency signal is pulled in a frequency range thereof whereby a fixed driving signal is supplied to said local oscillation light source, wherein said sweep circuit includes a counter for counting output pulses of an oscillator, and means for converting a counted value of said counter to said sweep signal.

BRIEF DESCRIPTION OF DRAWINGS

The invention will be explained in more detail in conjunction with appended drawings wherein, FIG. 2 is a block diagram showing an intermediate frequency monitor in the first emobodiment.

DESCRIPTION OF PREFERRED EMBODIMENTS

Figure 1:
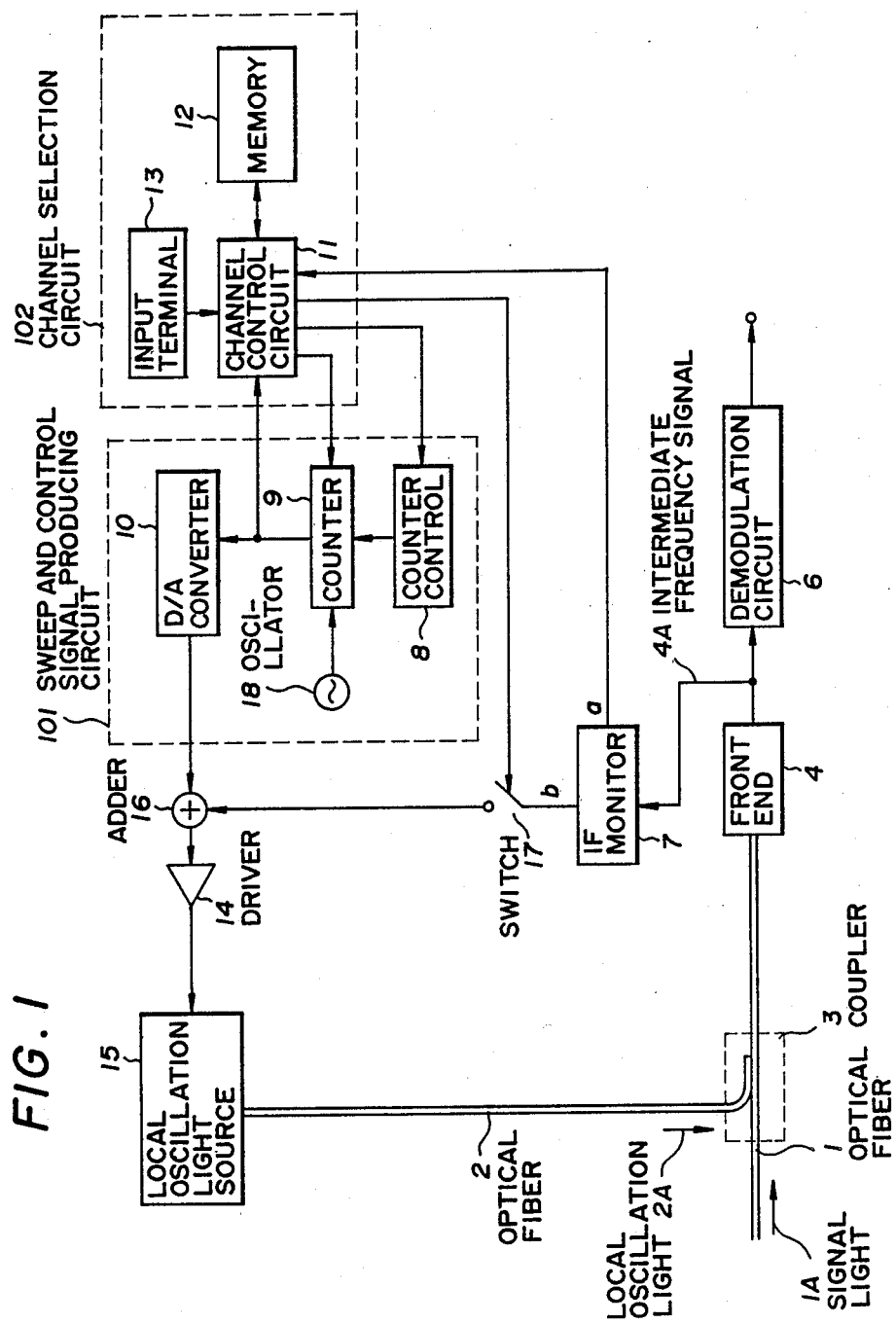
FIG. 1 is a block diagram showing an optical apparatus for pulling an intermediate frequency in a predetermined frequency range in a first embodiment according to the invention.

In FIG. 1, there is shown an optical apparatus for pulling an intermediate frequency in a predetermined frequency range in a first embodiment according to the invention. The optical apparatus comprises an optical coupler 3 for combining local oscillation light 2A of an optical fiber 2 to signal light 1A of an optical fiber 1, a front end 4 for converting light signal thus combined to electric signal which is an intermediate frequency signal 4A, a demodulation circuit 6 for producing a demodulated signal in accordance with the intermediate frequency signal, and IF monitor for producing a presence or non-presence signal of an IF signal at an output terminal a in accordance with the intermediate frequency signal and for producing an IF stabilization signal at an output terminal b in accordance therewith, a sweep and control signal producing circuit 101 to be explained in detail later, a channel selection circuit 102 also to be explained later, an adder 16 for adding the IF stabilization signal to a sweep signal and a control signal supplied from the sweep and control signal producing circuit 101, a driver 14 for producing a driving signal in accordance with output signal of the adder 14, and a local oscillation light source 15 which is driven by receiving the driving signal of the driver 14 at a frequency control terminal thereof.

The sweep and control signal producing circuit 101 comprises a counter control circuit 8 for producing a counter control signal, a counter 9 of twelve bit-up and down counter in which up and down countings are changed to be performed by a counted value of $2^{12}$ and for counting pulse signals of an oscillator 18 in accordance with the counter control signal, and a D/A converter 10 for converting an output value of the counter 9 to an analog signal which is the sweep or control signal.

The channel selection circuit 102 comprises a channel control circuit 11 for the control of channel selection in which a predetermined channel is selected from a wavelength division multiplexed signal of the signal light 1A, a memory 12 for storing channels at addresses, and an input terminal 13 for instructing a selection of the predetermined channel.

Figure 3A:
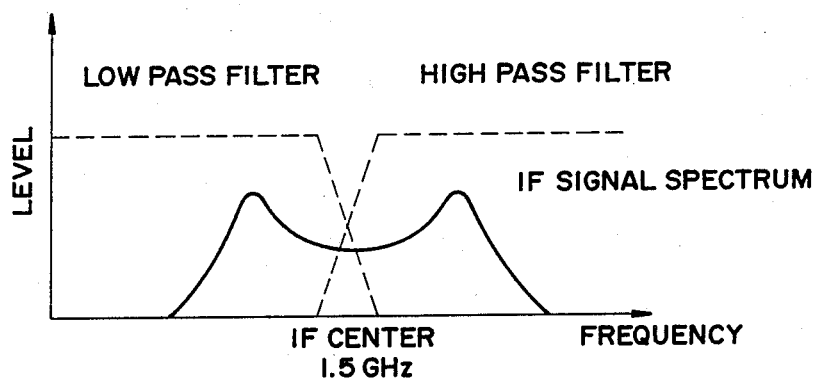
FIGS. 3A and 3B are explanatory diagrams showing characteristics of low and high pass filters and of a dividing circuit in the first embodiment.
Figure 3B:
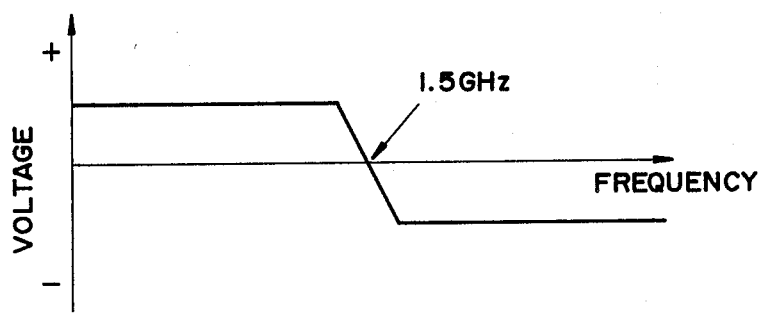

FIG. 2 shows the IF monitor 7 which comprises high and low pass filters 20 and 22 to which the intermediate frequency signal is supplied and having high and low pass characteristics as shown in FIG. 3A, envelope detection circuits 21 and 22 for detecting envelopes of high and low components passed through the high and low pass filters 20 and 22, an adder 24 for adding output signals of the envelope detection circuits 21 and 23 to produce an added signal (not dependent on a frequency of the IF signal, but proportional to a level thereof), a subtracter 25 for subtracting the output signal of the envelope detection circuit 21 from the output signal of the envelope detection circuit 23, a discrimination circuit 26 for producing the presence or non-presence signal of the intermediate signal at the output terminal a in accordance with the added signal of the adder 29, and a dividing circuit 27 for producing a frequency discriminating signal (which is the IF stabilization signal and which is not dependent on a level of the IF signal) as shown in FIG. 3B at the output terminal b in accordance with the output signal of the adder 24 and output of the subtracter 25.

In operation, the signal light 1A of a wavelength division multiplexed signal including 10 channels and the local oscillation light 2A are combined in the optical coupler 3, and the light signal thus combined is converted in the front end 4 to the electric signal thereby producing the intermediate frequency signal 4A which is then divided into two IF signals. One of the IF signals 4A is supplied to the demodulation circuit 6, and the other one is supplied to the IF monitor 7. In the IF monitor 7, the IF signal 4A is supplied to the high and low pass filters 20 and 22 having the high and low pass characteristics which cross at a predetermined center frequency of 1.5 GHz for the IF signal 4A. The output signals of the high and low pass filters 20 and 22 are supplied to the envelope detection circuits 21 and 23 respectively, and those of the envelope detection circuits 21 and 23 are supplied to both the adder 24 and the subtracter 25 respectively. As a result, the added signal which is not dependent on a frequency of the IF signal 4A and is proportional to a level of the IF signal is obtained in the adder 24, and the output signals of the adder 24 and the subtracter 25 are supplied to the dividing circuit 27 in which the frequency discriminating signal (not dependent on a level of the IF signal) as shown in FIG. 3B is obtained to be on the center frequency of 1.5 GH. On the other hand, the presence or non-presence of the IF signal is detected in the discrimination circuit 26 to which the output signal of the adder 24 is supplied so that the presence or non-presence signal of the IF signal is supplied through the output terminal a of the IF monitor 7 from the discrimination circuit 26 to the channel control circuit 11.

Just after receiving the signal light 1A, a sweep request signal is supplied from the channel control circuit 11 to the counter control circuit 8 so that the counter control circuit 8 controls the counter 9 to count output pulses of the oscillator 18. A counted value of the counter 9 is converted in the D/A converter 10 from which an analog sweep signal is supplied to the adder 16. The local oscillation light source 15 is driven in accordance with a driving signal of the driver 14 dependent on the analog sweep signal which is applied to the frequency control terminal thereof so that a bias current injected thereto is controlled to change an oscillation frequency. Thus, a sweep of the oscillation frequency is performed in the local oscillation light source 15. During a stage of the oscillation frequency sweep, the presence or non-presence signal of the IF signal is supplied from the IF monitor 7 to the channel control circuit 11 so that the channel control circuit 11 detects a counted value of the counter 9 to produce a channel signal when the presence signal of the IF signal is produced in the IF monitor 7. In this manner, addresses of 10 channels are stored in the memory 12 in one period of the oscillation frequency sweep. Thereafter, a sweep stopping signal is supplied from the channel control circuit 11 to the counter control circuit 8 so that a sweep of the oscillation frequency is stopped to be performed in the local oscillation light source 15, while the channel control circuit 11 waits for an input of a channel selection signal at the input terminal 13. Consequently, a stand-by of the receiver is completed in accordance with the above described procedures.

Next, the channel selection signal is supplied from the input terminal 13 to the channel control circuit 11 in which an address corresponding to a channel thus selected is read from the memory 12. The address is then written into the counter 9 by the channel control circuit 11 so that an analog control signal corresponding to the channel is supplied from the D/A converter 10 to the adder 16. As a result, a frequency of the IF signal 4A of the selected channel is pulled in a frequency range of the AFC. In this circumstance, an AFC request signal which is the IF presence signal is supplied from the output terminal a of the IF monitor 7 to the channel control circuit 11 in which a switching signal for turning the switch 17 from OFF to ON is produced. At the same time, an IF stabilization signal is supplied from the output terminal b thereof through the switch 7 to the adder 16. Finally, the IF of the selected channel is stabilized in accordance with the output signal of the adder 16 including the IF stabilization signal and the address signal which is supplied to the driver 14 for driving the local oscillation light source 15.

In a case where a channel is changed over to a newly selected channel among 10 channels, a switching signal for turning the switch 17 from ON to OFF is supplied from the channel control circuit 11 to the switch 17 so that the AFC operation of the IF monitor 7 is stopped to be performed. Then, an address of the newly selected channel is read from the memory 12 to be written into the counter 9 so that the same procedure as described before is repeated to pull the IF of the newly selected channel in a frequency range of the AFC operation. Accordingly, an IF of a predetermined channel is pulled in a frequency range of the AFC operation and is then stabilized exactly on a predetermined intermediate frequency.

A flow of the above described operation will be explained as follows.

STEP 1—a sweep request signal from the channel control circuit 11 to the counter control circuit 8

STEP 2—a count starting signal from the counter control circuit 8 to the counter 9

STEP 3—a counting of output pulses of the oscillator 18 at the counter 9

STEP 4—a counted value of twelve bits from the counter 9 to the D/A converter 10

STEP 5—An analog sweep signal from the D/A converter 10 to the local oscillation light source 15

STEP 6—a presence or non-presence signal of the IF signal 4A from the output terminal a of the IF monitor 7 to the channel control circuit 11 during a sweep operation STEP 7—a transfer of a counted value of the counter 9 from the channel control circuit 11 to the memory 12 at the generation of the presence signal in the IF monitor 7

STEP 8—a preparation of a data base of a relation between addresses of the counted values and channels at the memory 12

STEP 9—a sweep stopping signal from the channel control circuit 11 to the counter control circuit 8 after the completion of the data base in the memory 12

STEP 10—a completion of an initial setting procedure and a waiting for a channel selection request STEP 11—an input of the channel selection request from the input terminal 13

STEP 12—a writing of an address corresponding to a selected channel read from the memory 12 to the counter 9 under the control of the channel control circuit 11

STEP 13—a supply of the address written into the counter 9 to the D/A converter

STEP 14—an analog control signal corresponding to the address from the D/A converter 10 to the local oscillation light source 15

STEP 15—an intermediate frequency 4A of the selected channel to be pulled in a frequency range of the IF monitor 7

STEP 16—an AFC request signal which is the IF presence signal from the output terminal a of the IF monitor 7 to the channel control circuit 11

STEP 17—a switch turning the channel control circuit 11 to the switch 17

STEP 18—a supply of an IF stabilizing signal from the output terminal b of the IF monitor 7

STEP 19—an application of the IF stabilizing signal through the adder 16 to the local oscillation light source 15

STEP 20—a starting and completion of the IF stabilizing operation of the selected channel STEP 21—a waiting for a further channel selection request STEP 22—an input of the further channel selection request from the input terminal 13

STEP 23—a switch turning-off signal from the channel control circuit 11 to the switch 17

STEP 24—a returning to the STEP 12

Figure 4:
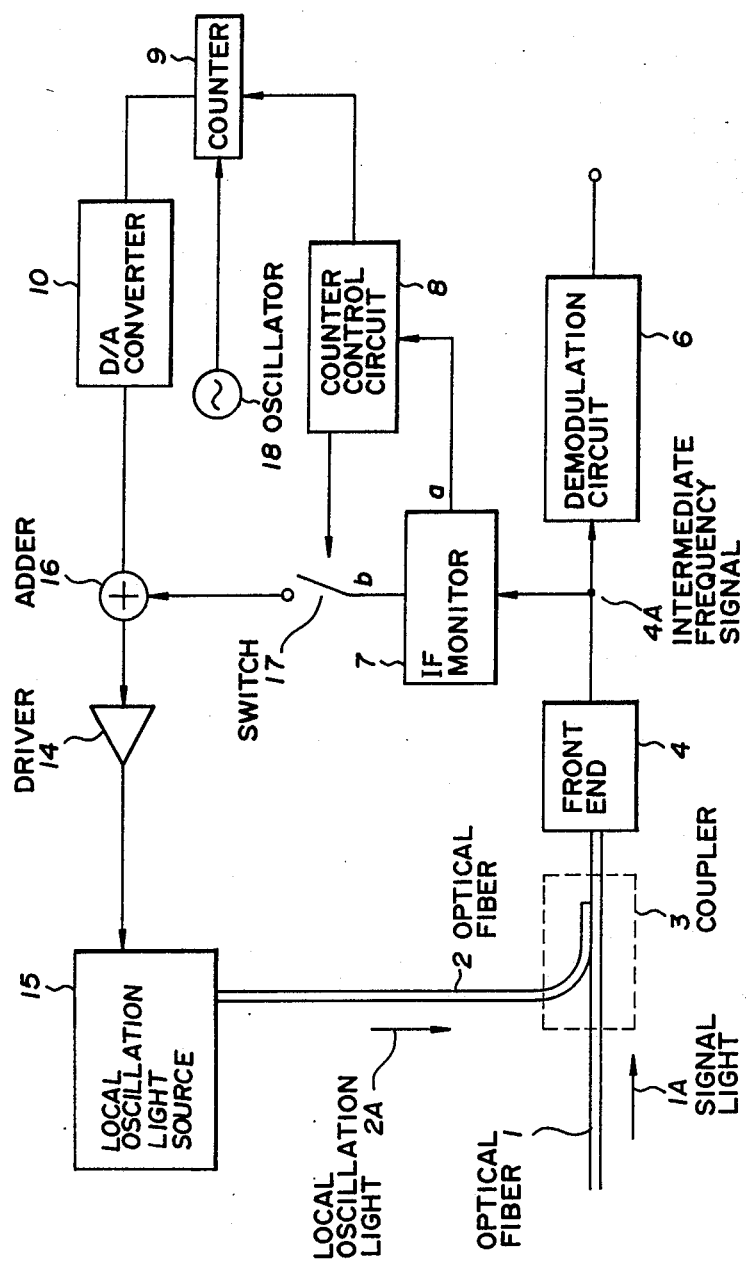
FIG. 4 is a block diagram showing an optical apparauts for pulling an intermediate frequency in a predetermined frequency range in a second embodiment according to the invention.

FIG. 4 shows an optical apparatus for pulling an intermediate frequency in a predetermined frequency range in a second embodiment according to the invention. The optical apparatus is adapted to be used in an optical heterodyne detection communication system in which signal light 1A of one channel is processed, and a demodulation of the signal light 1A is performed immediately after the signal light 1A is transmitted in a burst mode. In FIG. 4, like parts are indicated by like reference numerals in FIG. 1 so that repeated explanations are omitted here.

In operation, no output is supplied from the output terminal a of the IF monitor 7 because the IF signal 4A is not supplied from the front end 4 when the signal light 1A is not transmitted. At this moment, a count request signal is supplied from the counter control circuit 8 to the counter 9 so that an oscillation frequency of the local oscillation light source 15 is swept until the IF signal 4A is supplied from the front end 4. When the signal light 1A is transmitted, the IF monitor 7 detects the IF signal 4A to supply a sweep stopping signal from the output terminal a to the counter control circuit 8. Then, a switch turning-on signal and a count stopping signal are supplied from the counter control circuit 8 so that an output value of the D/A converter 10 is held, and an AFC operation is started to be performed in the same manner as in the first embodiment. As a result, the IF is started to be stabilized in a short period.

Figure 5:
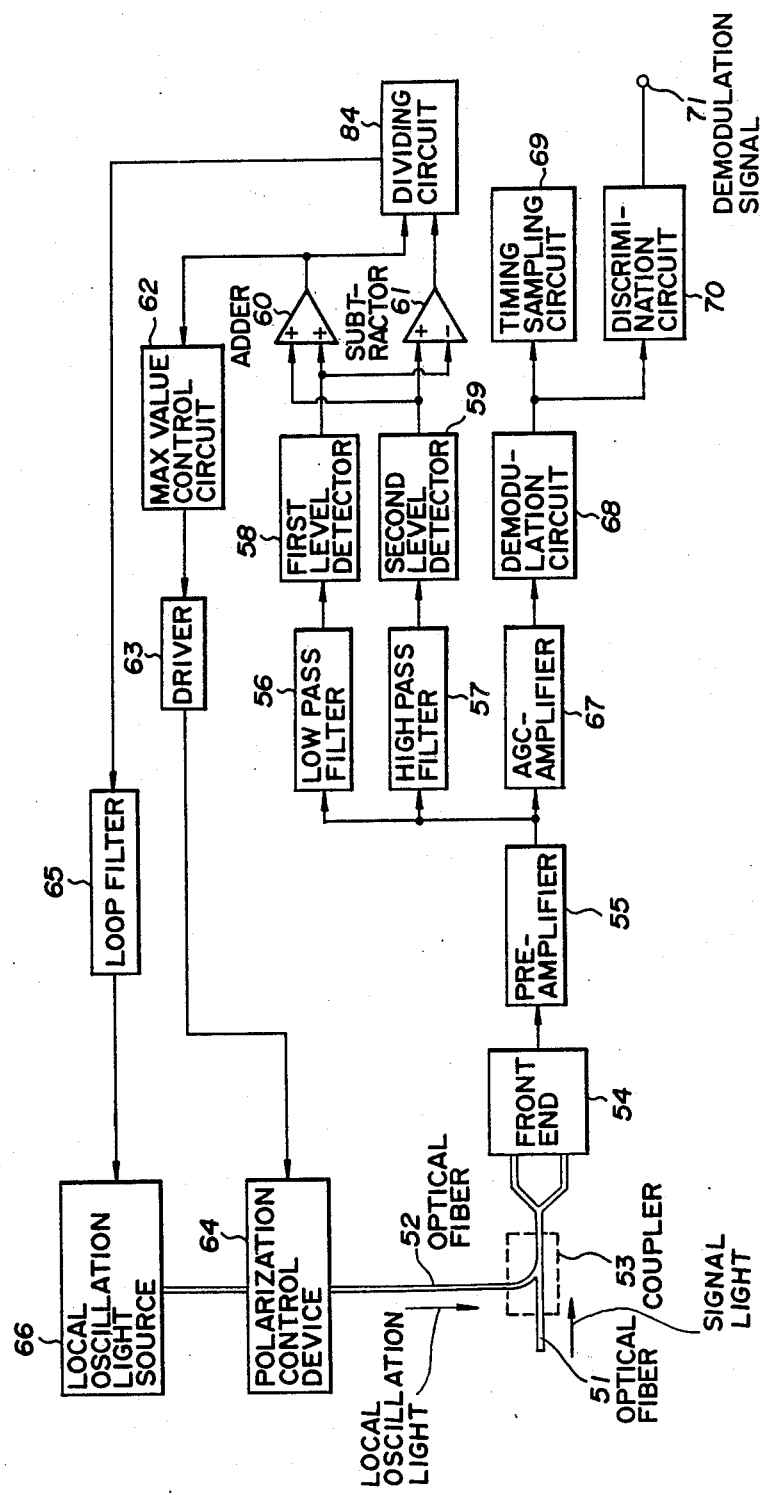
FIG. 5 is a block diagram showing an optical apparatus for stabilizing an intermediate frequency which is applied to the apparatus in FIGS. 1 and 4, FIGS. 6A and 6B are explanatory diagrams showing characteristics of low and high pass filters and of dividing circuit in FIG. 5.
Figure 6A:
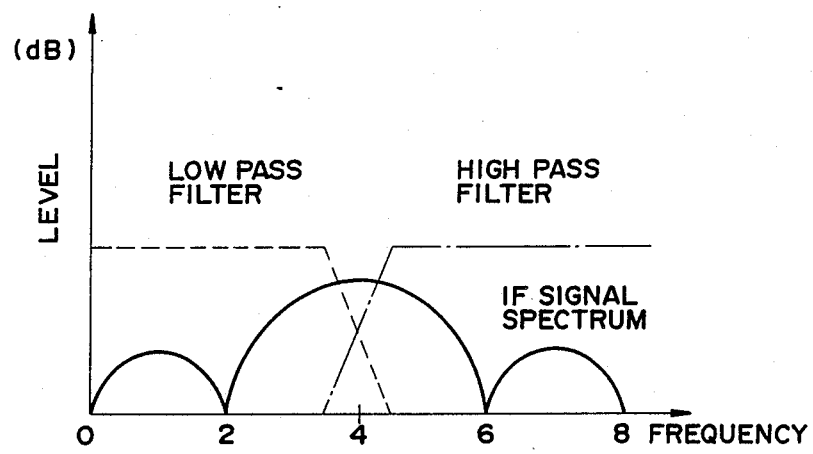
Figure 6B:
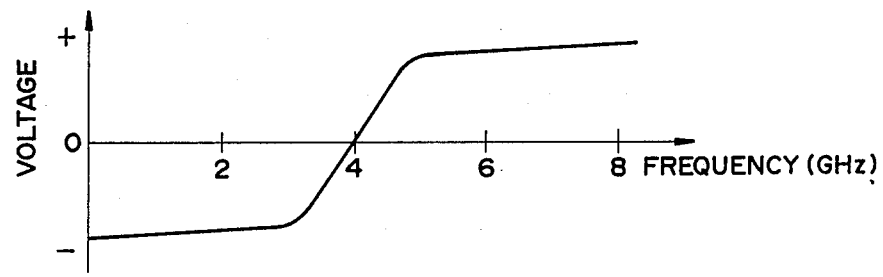

FIG. 5 shows an optical apparatus for the stabilization of an intermediate frequency which is applied to the apparatus in FIGS. 1 and 4. In the apparatus, signal light which is Phase Shift Keying-modulated with 2 Gb/S is transmitted through an optical fiber 51 to be combined in an optical coupler 53 with local oscillation light supplied through an optical fiber 52 from a local oscillation light source 66. Light signal thus combined is supplied to a front end 54 including an optical detector and an equalizing amplifier in which the light signal is converted to electric signal. The converted electric signal is amplified in a pre-amplifier 55, and then divided into three signals which are supplied to a low pass filter 56, a high pass filter 57, and an AGC amplifier 67 correspondingly. An output signal of the pre-amplifier 55 is of a frequency spectrum as shown in FIG. 6A, and the low and high pass filter 56 and 57 are of band-pass characterics which cross at a center frequency of 4 GHz to be set also as shown in FIG. 6A. An output signal of the low pass filter 56 is detected in a level thereof by a first level detector 58, and then divided to be supplied to an adder 60 and a subtracter 61. In the same manner, an output signal of the high pass filter 57 is detected in a level thereof by a second level detector 59, and then divided to be supplied to the adder 60 and the substracter 61. As a result, there is obtained an output of the adder 10 which is not dependent on a frequency of the IF signal, but on a level thereof. Outputs of the adder 60 and the subtracter 61 are supplied to a dividing circuit 84, an output of which is not dependent on a level of the IF signal, but on a frequency fluctuation thereof. FIG. 6B shows a frequency response of the output supplied from the dividing circuit 84. A maximum value control circuit 62 is connected to the adder 60 thereby receiving the output thereof so that a polarization control device 64 is thereby controlled through a driver 63 whereby a maximum value is constantly supplied from the adder 60. In a system described above, polarizations of the signal light and the local oscillation light are constantly consistent with each other.

Further, the local oscillation light source 66 is controlled through a loop filter 65 in accordance with the output signal of the dividing circuit 84 as shown in FIG. 6B such that the output signal is added to bias current of the local oscillation light source 66. As a result, a frequency of the IF signal is stabilized to be 4 GHz. In other words, the output of the dividing circuit 84 is controlled to be "zero". If an offset is existed, the output is also controlled to be "zero" in consideration of the offset. On the other hand, the IF signal which is supplied to the AGC amplifier 67 is amplified therein, and is then demodulated in the demodulation circuit 68. A baseband signal of 2 Gb/S which is supplied from the demodulation circuit 18 is discriminated and regenerated by a timing sampling circuit 69 and a discrimination circuit 70 so that a demodulation signal 71 is supplied from the discrimination circuit 70.

Figure 7:
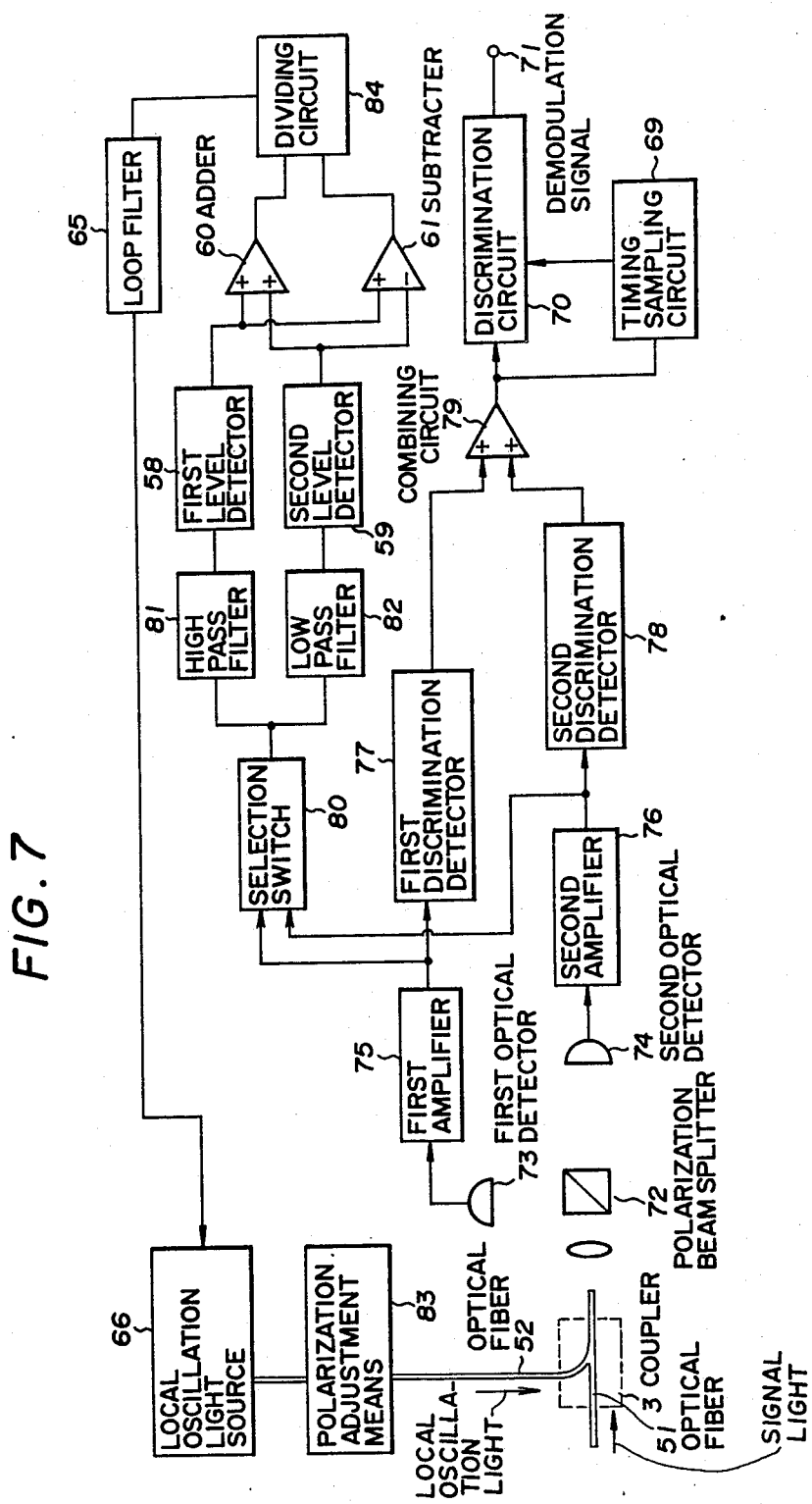
FIG. 7 is a block diagram showing an optical apparatus for stabilizing an intermediate frequency which is applied to the apparatus in FIGS. 1 and 4, and FIGS. 8A and 8B are explanatory diagrams showing characteristics of low and high pass filters and of dividing circuit in FIG. 7.
Figure 8A:
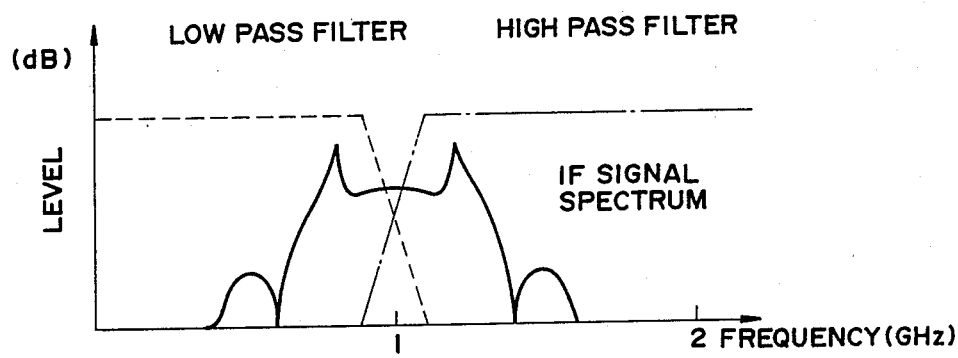
Figure 8B:
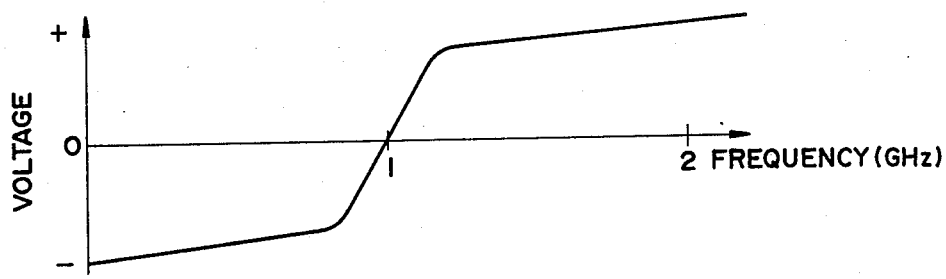

FIG. 7 shows an optical apparatus for the stabilization of an intermediate frequency which is applied to the apparatus in FIGS. 1 and 4. The apparatus is adapted to be used in an optical heterodyne detection receiver of a polarization diversity type in which Frequency Shift Keying-modulated light signal of 400 Mb/S is demodulated, and an automatic polarization control described in FIG. 5 is not necessary to be performed. In the apparatus, signal light which is FSK-modulated with 400 Mb/S is transmitted through an optical fiber 51 to be combined in an optical coupler 53 with local oscillation light supplied through an optical fiber 52 from a local oscillation light source 66. Light signal thus combined is divided in a polarization beam splitter 72 into two light signals, polarizations of which are orthogonal to each other, to be supplied to first and second optical detectors 73 and 74 correspondingly. Levels of the two light signals are equal to each other because the local oscillation light is controlled in a polarization thereof by a polarization adjustment means 83 positioned between the light source 66 and the optical coupler 53. Outputs of the first and second optical detectors 73 and 74 are amplified in first and second amplifiers 75 and 76 respectively, and then divided to be supplied to a first discrimination detector 77 and a selection switch 80 and to a second discrimination detector 78 and the selection switch 80 respectively. The selection switch 80 selects one of two inputs which is higher in a level thereof than the other to be supplied to high and low pass filters 81 and 82 of band-pass characteristics which cross on a center frequency of 1 GHz to be set as shown in FIG. 8A. An output signal of the selection switch 80 is also shown in a frequency spectrum thereof in FIG. 8A. Outputs of the high and low pass filters 81 and 82 are detected in levels thereof by first and second level detectors 58 and 59, outputs of which are supplied to an adder 60 and a subtracter 61. Then, outputs of the adder 60 and the subtracter 61 are supplied to a dividing circuit 84 from which an output signal not dependent on a level of the IF signal, but on a frequency fluctuation thereof is supplied as shown in FIG. 8B. The output signal of the dividing circuit 84 is supplied through a loop filter 65 to the local oscillation light source 66 thereby being added to bias current therein to control an oscillation frequency thereof. As a result, a frequency of the IF signal is stabilized to be 1 GHz. On the other hand, outputs of the first and second discrimination detectors 77 and 78 are supplied to a combining circuit 79 from which a baseband signal of a constant amplitude not dependent on a polarization fluctuation of the signal light is supplied to a timing sampling circuit 69 and a discrimination circuit 70. Finally, a demodulation signal 71 is obtained in the discrimination circuit 70.

Although the dividing circuit 84 is used to maintain the stabilization of the intermediate frequency in spite of a level fluctuation of the IF signal in the embodiments, it may be omitted so that the output of the subtracter 61 is supplied to the local oscillation light source 66 to simplify the construction of a system in a case where a level of the IF signal is less fluctuated.

Although the invention has been described with respect to specific embodiment for complete and clear disclosure, the appended claims are not to thus limited but are to be construed as embodying all modification and alternative constructions that may occur to one skilled in the art which fairly fall within the basic teaching herein set forth.

What is claimed is:

1. An optical apparatus for pulling an intermediate frequency in a predetermined frequency range, comprising:
    an optical coupler for combining a wavelength division multiplexed signal light propagated through an optical fiber and a local oscillation light of a local oscillation light source to provide a combined signal light;
    means for producing an intermediate frequency signal in accordance with said combined signal light;
    a counter for counting output pulses supplied from an oscillator;
    a digital to analog converter for producing an analog sweep signal in accordance with a counted value of said counter, said analog sweep signal being supplied to said local oscillation light source;
    a monitor circuit for producing intermediate frequency presence signals when said intermediate frequency signal is pulled in predetermined frequency ranges;

a control circuit for controlling said counter to count and stop counting said output pulses in accordance with said intermediate frequency presence signal;

a memory for storing counted values of said counter as addresses when said intermediate frequency presence signals are produced, and channel numbers corresponding to said addresses; and an input terminal for supplying a channel number, to be selected among said channel numbers, to said control circuit;

wherein said control circuit reads an address corresponding to said channel number to be selected from said memory, and controls said digital to analog converter to produce said sweep signal having a level corresponding to said address.

2. An optical apparatus for pulling an intermediate frequency in a predetermined frequency range according to claim 1, wherein:

said control circuit controls said digital to analog converter to produce said analog sweep signal for the sweeping of a local oscillation light frequency prior to receiving said wavelength division multiplexed signal light, and controls said memory to store said addresses corresponding to said channel numbers, whereby said control circuit reads said address corresponding to said channel number to be selected from said memory, and controls said digital to analog converter to produce said sweep signal having said level corresponding to said address.

3. An optical apparatus for pulling an intermediate frequency in a predetermined frequency range according to claim 1, wherein said monitor circuit comprises:

a high pass filter for passing a high frequency signal component of said intermediate frequency signal on the side of a high frequency relative to an intermediate frequency to be set;

low pass filter for passing a low frequency signal component of said intermediate frequency signal on the side of a low frequency relative to said intermediate frequency to be set;

first and second power level detectors for detecting power levels of said high and low frequency signal components separately, thereby producing first and second power level signals; and a subtracter for performing a subtraction between said first and second power level signals to produce an intermediate frequency discriminating signal for controlling an oscillation frequency of said local oscillation light source.

4. An optical apparatus for pulling an intermediate frequency in a predetermined frequency range according to claim 3, wherein said monitor circuit further comprises:

an adder for adding said first and second power level signals to produce an added signal; and a dividing circuit for dividing said added signal by said intermediate frequency discriminating signal supplied from said subtracter to produce an intermediate frequency discriminating signal which is not dependent on a level of said intermediate frequency signal.

* * * * *